United States Patent
Yang et al.

(10) Patent No.: US 11,715,644 B2
(45) Date of Patent: Aug. 1, 2023

(54) METHOD FOR PACKAGING INTEGRATED CIRCUIT CHIP

(71) Applicant: MACROBLOCK. INC., Hsinchu (TW)

(72) Inventors: Li-Chang Yang, Hsinchu (TW); Yi-Sheng Lin, Hsinchu (TW)

(73) Assignee: MACROBLOCK, INC., Hsinchu (TW)

( * ) Notice: Subject to any disclaimer, the term of this patent is extended or adjusted under 35 U.S.C. 154(b) by 323 days.

(21) Appl. No.: 17/248,374

(22) Filed: Jan. 22, 2021

(65) Prior Publication Data

US 2021/0257222 A1    Aug. 19, 2021

(30) Foreign Application Priority Data

Feb. 14, 2020   (TW) ................................ 109104736

(51) Int. Cl.
*H01L 21/48* (2006.01)
*H01L 21/56* (2006.01)

(52) U.S. Cl.
CPC ........ *H01L 21/4825* (2013.01); *H01L 21/565* (2013.01)

(58) Field of Classification Search
CPC ............... H01L 21/4825; H01L 21/565; H01L 2224/48091; H01L 2224/73265; H01L 2224/48247; H01L 2224/45144; H01L 2224/73204; H01L 2924/181; H01L 24/73; H01L 24/81; H01L 24/48
See application file for complete search history.

(56) References Cited

U.S. PATENT DOCUMENTS

| | | | | |
|---|---|---|---|---|
| 9,824,956 | B2* | 11/2017 | Fontana | H01L 23/4952 |
| 2006/0151861 | A1* | 7/2006 | Noquil | H01L 23/488 |
| | | | | 257/E23.101 |
| 2008/0102563 | A1* | 5/2008 | Lange | H01L 21/561 |
| | | | | 257/E23.031 |
| 2010/0006623 | A1* | 1/2010 | Lange | H01L 21/561 |
| | | | | 228/101 |

(Continued)

FOREIGN PATENT DOCUMENTS

| | | |
|---|---|---|
| TW | 200633149 A | 9/2006 |
| TW | 200830442 A | 7/2008 |
| TW | 201023305 A1 | 6/2010 |

OTHER PUBLICATIONS

Search Report appended to an Office Action, which was issued to Taiwanese counterpart Application No. 109104736 by the TIPO dated Aug. 30, 2021 with an English translation thereof.

*Primary Examiner* — Jaehwan Oh
*Assistant Examiner* — John M Parker
(74) *Attorney, Agent, or Firm* — MLO, a professional corp.

(57) ABSTRACT

A method for packaging an integrated circuit chip includes the steps of: a) providing a plurality of dies and a lead frame which includes a plurality of bonding parts each having a die pad, a plurality of leads each having an end region disposed on and connected to the die pad, and a plurality of bumps each disposed on the end region of a respective one of the leads; b) transferring each of the dies to the die pad of a respective one of the bonding parts to permit each of the dies to be flipped on the respective bonding part; and c) hot pressing each of the dies and the die pad of a respective one of the bonding parts to permit each of the dies to be bonded to the bumps of the respective bonding part.

7 Claims, 6 Drawing Sheets

(56) References Cited

U.S. PATENT DOCUMENTS

| | | | | |
|---|---|---|---|---|
| 2010/0133671 A1* | 6/2010 | Tzu | ................... | H01L 23/49816 |
| | | | | 257/676 |
| 2010/0144120 A1* | 6/2010 | Segawa | ................... | H01L 24/27 |
| | | | | 438/464 |
| 2010/0200874 A1* | 8/2010 | Shioi | ................ | C09K 11/77348 |
| | | | | 313/503 |
| 2011/0300671 A1* | 12/2011 | Pu | ....................... | H01L 23/4951 |
| | | | | 438/123 |
| 2016/0237288 A1* | 8/2016 | Shiga | ....................... | C09J 11/06 |

* cited by examiner

METHOD FOR PACKAGING INTEGRATED CIRCUIT CHIP

CROSS-REFERENCE TO RELATED APPLICATION

This application claims priority of Taiwanese Invention Patent Application No. 109104736, filed on Feb. 14, 2020.

FIELD

The disclosure relates to a method for packaging a semiconductor device, and more particularly to a method for packaging an integrated circuit chip.

BACKGROUND

In the front-end-of-line (FEOL) process for packaging integrated circuits (IC), a plurality of dies are mainly manufactured through the steps of wafer fabrication, circuit design, and wafer cutting. Subsequently, each of the dies is electrically connected to a lead frame through a wire bonding process or a flip chip bonding process, and is then subjected to a packaging process. As reference, U.S. Pat. No. 10,622,314 B2 discloses chip package structures made by wire bonding or flip chip bonding.

In the wire bonding process, the material selected for making solder wires and the length thereof might affect the cost and signal transmission of an integrated circuit chip. In addition, the wire bonding process is complicated. With respect to the flip chip bonding process, a die is subjected to a bumping treatment without the use of solder wires. In other words, the die is formed with a bump (e.g., a solder ball) and is then soldered to the lead frame through such bump.

However, regardless of using the wire bonding process or flip chip bonding process for bonding the die to the lead frame, the efficiency of such processes is still limited.

SUMMARY

Therefore, an object of the disclosure is to provide a method for packaging an integrated circuit chip.

According to the disclosure, a method for packaging an integrated circuit chip includes the steps of:

a) providing a plurality of dies and a lead frame, the lead frame including a plurality of bonding parts, each having
  a die pad,
  a plurality of leads each connected to the die pad, and
  a plurality of bumps each disposed on a respective one of the leads and located above the die pad;

b) transferring each of the dies to the die pad of a respective one of the bonding parts to permit each of the dies to be flipped on the respective bonding part; and c) hot pressing each of the dies and the die pad of a respective one of the bonding parts to permit each of the dies to be bonded to the bumps of the respective bonding part.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
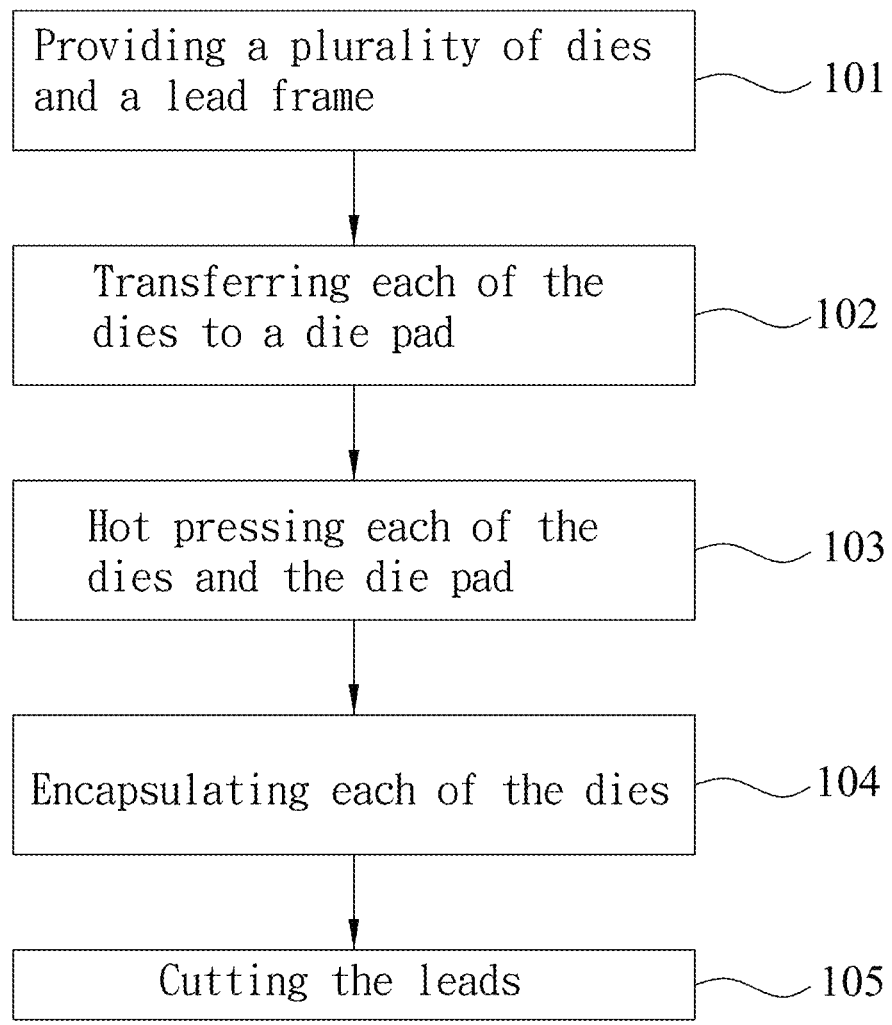
FIG. 1 is a flow chart illustrating consecutive steps of a method for packaging an integrated circuit chip.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
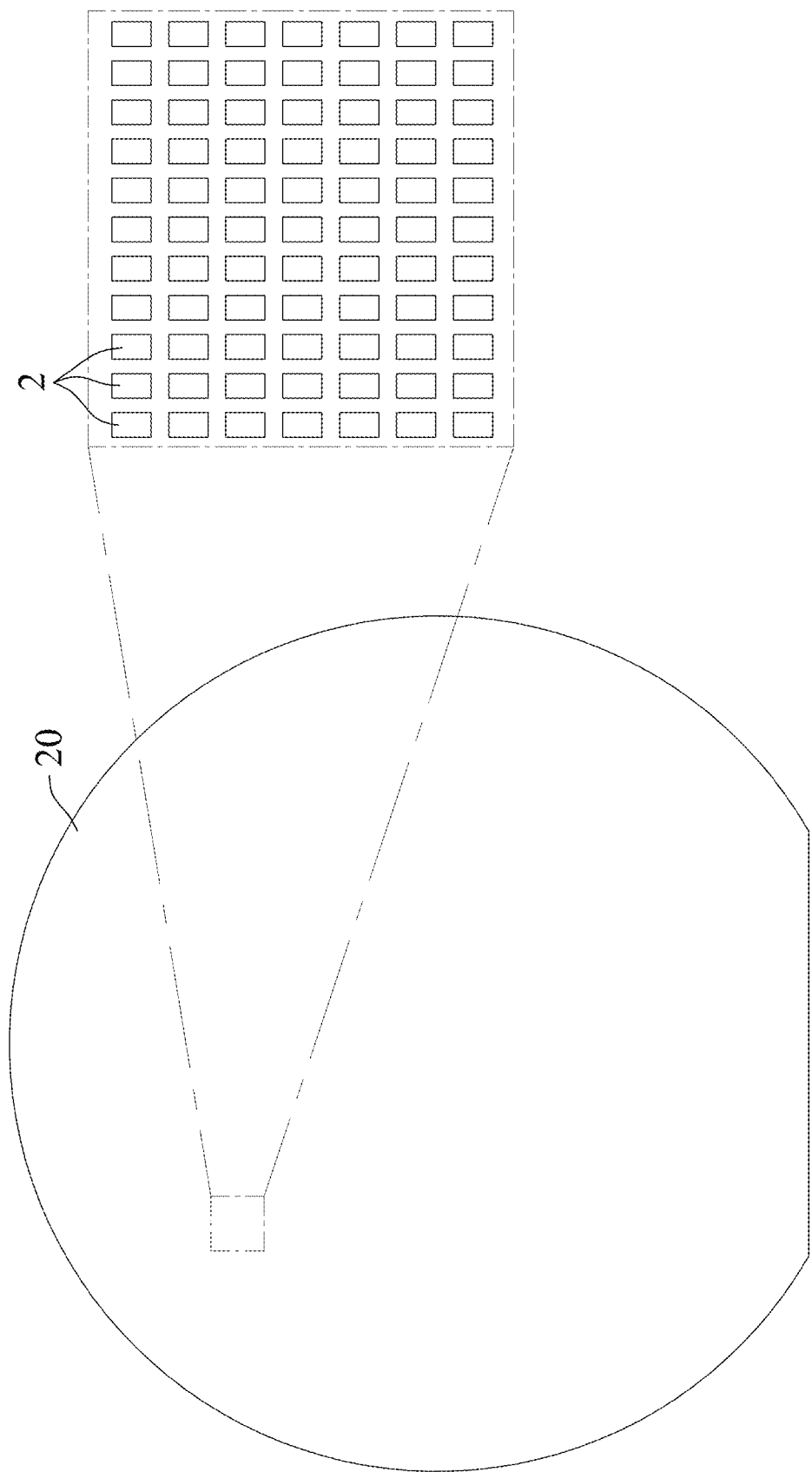
FIG. 2 is a schematic top view illustrating a plurality of dies provided in the method.
Figure 3:
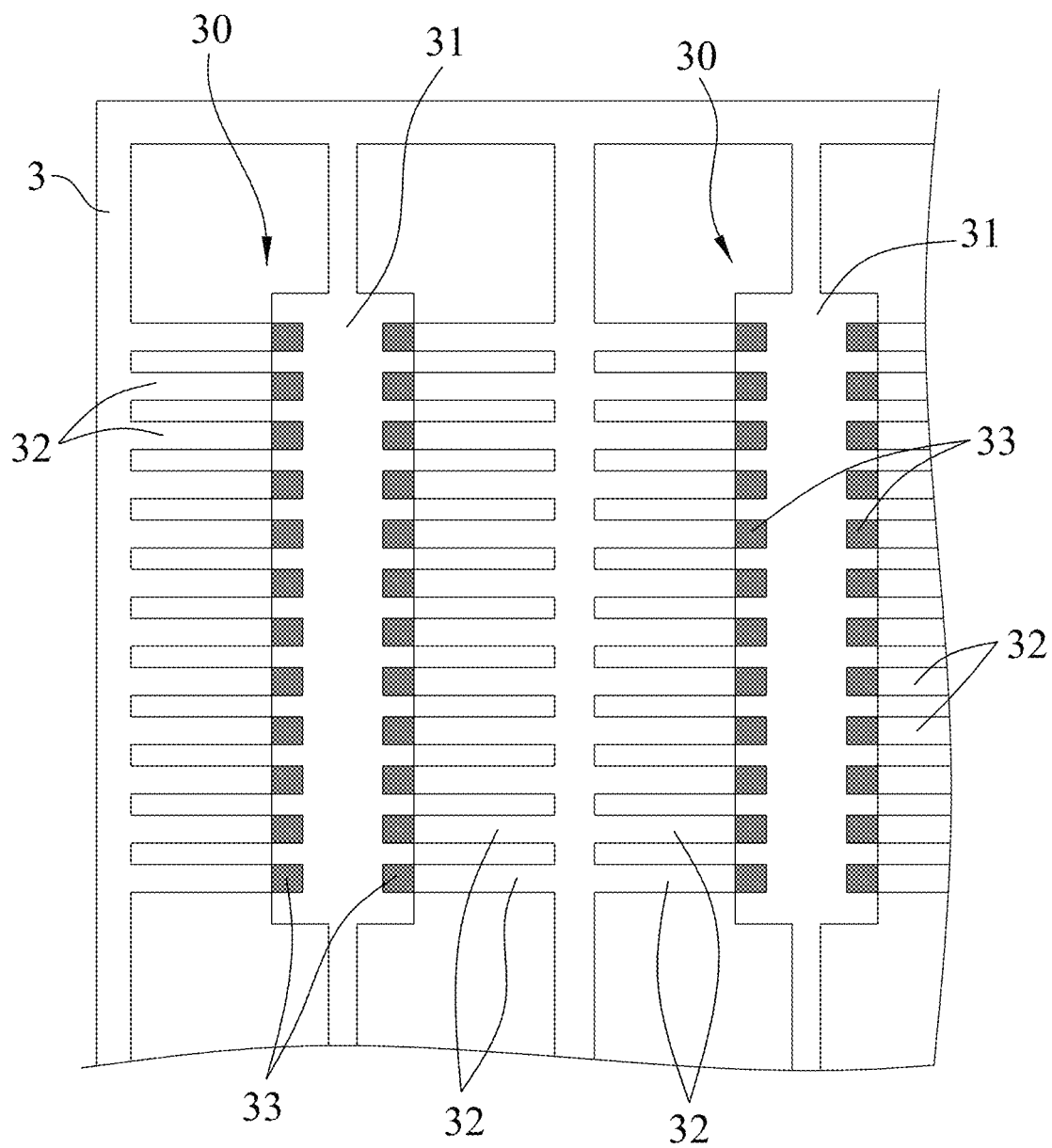
FIG. 3 is a schematic top view illustrating a lead frame provided in the method.

FIGS. 1 to 3 illustrate a method for packaging an integrated circuit chip according to an embodiment of the disclosure. The method includes the following consecutive steps 101 to 105.

In step 101, a plurality of dies 2 and a lead frame 3 are provided. Each of the dies 2 is obtained by cutting a wafer 20 having microcircuit patterns. In other words, each of the dies 2 is an unpackaged integrated circuit (IC) chip. Specifically, the wafer 20 is mounted on a gel layer (not shown), e.g., a blue tape, and is then subjected to a cutting process, so as to obtain the dies 2.

The lead frame 3 is provided for disposition of the dies 2 and for use in subsequent packaging process. The lead frame 3 may be made of a metallic material and may have a sheet shape. The lead frame 3 includes a plurality of bonding parts 30. The bonding parts 30 may be arranged in an array. Each of the bonding parts 30 has a die pad 31, a plurality of leads 32 each connected to the die pad 31, and a plurality of bumps 33 each disposed on a respective one of the leads 32 and located above the die pad 31.

Specifically, in this embodiment, each of the leads 32 has an end region disposed on and connected to the die pad 31, and each of the bumps 33 is disposed on the end region of the respective lead 32. There are no particular limitation on the number of the leads 32. Two adjacent ones of the bonding parts 30 may have the same or different number of the leads 32. There are no particular limitation on the material for making the bumps 33. In this embodiment, each of the bonding parts 30 of the lead frame 3 has 24 of the leads 32. The bump 33 is made of tin.

Figure 4:
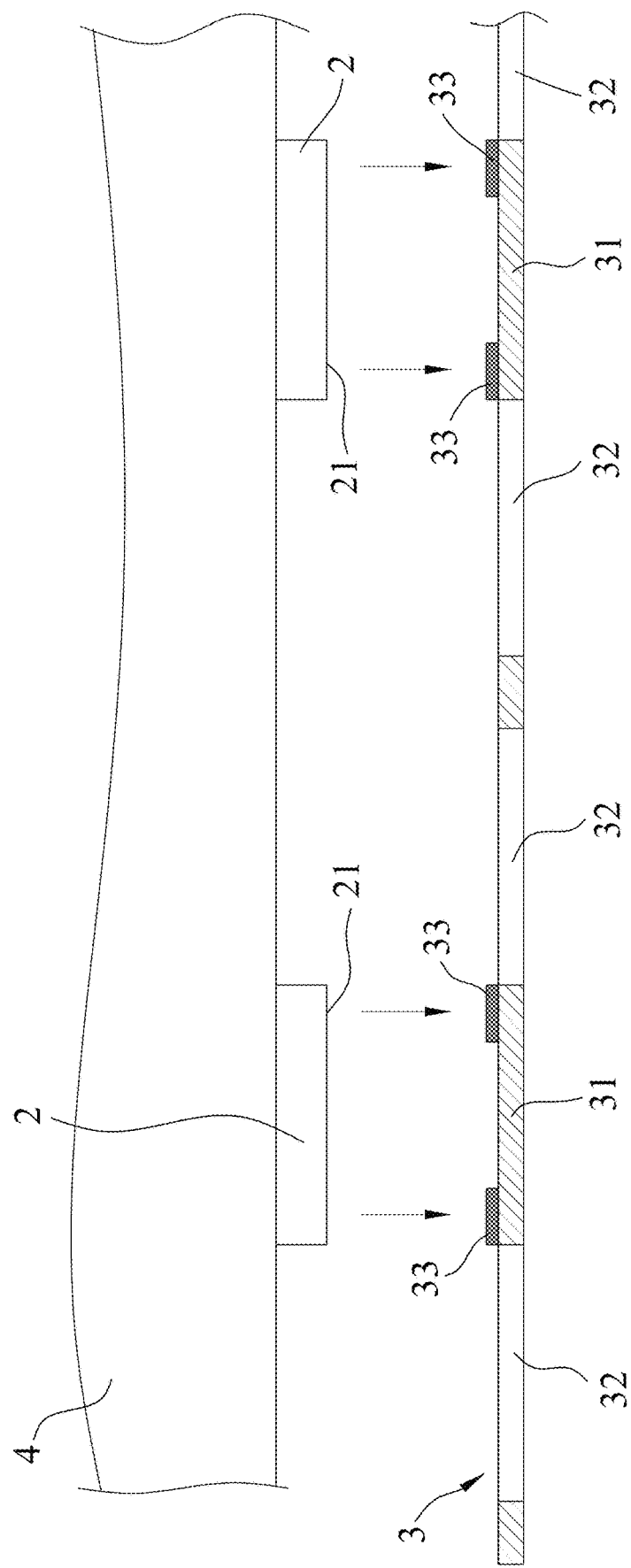
FIG. 4 shows a schematic side view illustrating a step of transferring the dies to the lead frame in the method.

In step 102, each of the dies 2 is transferred to the die pad 31 of a respective one of the bonding parts 30 to permit each of the dies 2 to be flipped on the respective bonding part 30 (see FIG. 4).

In certain embodiments, step 102 may include the substeps of: i) disposing each of the dies 2 on a temporary substrate (not shown), and ii) transferring each of the dies 2 on the temporary substrate, by a suction device 4, to the die pad 31 of the respective bonding part 30.

In step 103, each of the dies 2 and the die pad 31 of a respective one of the bonding parts 30 are hot pressed to permit each of the dies 2 to be bonded to the bumps 33 of the respective bonding part 30.

Figure 5:
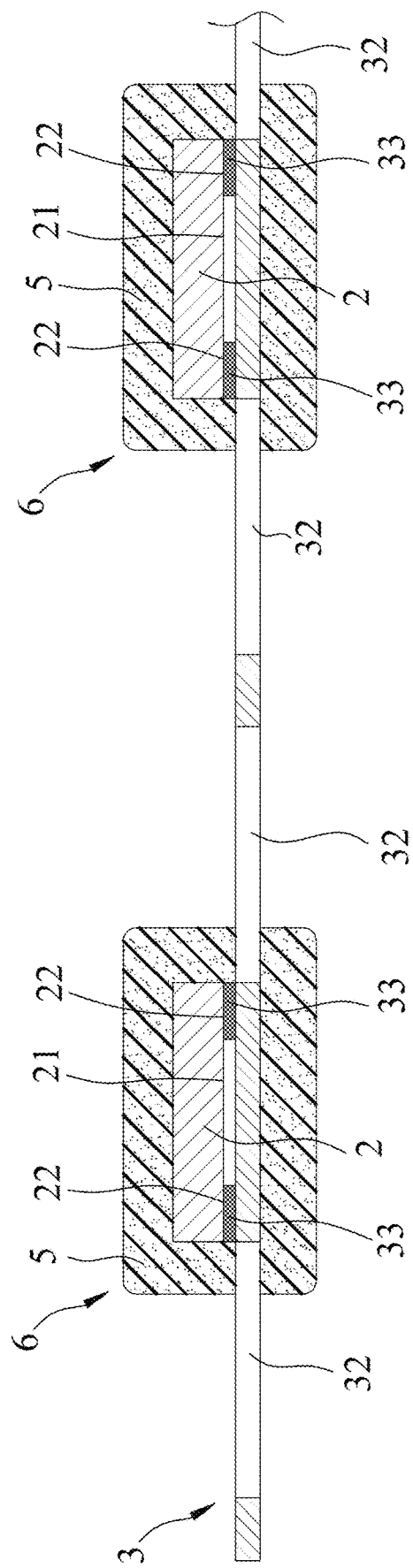
FIG. 5 is a cross-sectional view illustrating each of the dies that is encapsulated using an encapsulant.

In an embodiment shown in FIGS. 4 and 5, the dies 2 to be bonded to the lead frame 3 are not previously subjected to the bumping process, and each of the dies 2 has a die surface 21 and a plurality of contact areas 22 which are separately formed in the die surface 21. Each of the contact areas 22 is at a level not higher than that of the die surface 21, such that in step 102, the contact areas 22 of each of the dies 2 are brought into register with the bumps 33 of the respective bonding part 30, thereby permitting each of the dies 2 to be bonded to the bumps 33 of the respective bonding part 30 in step 103. In some embodiments, each of the contact areas 22 may be flushed with the die surface 21. In other embodiments, each of the contact areas 22 may be at a level lower than that of the die surface 21.

Step 104 is implemented after steps 102 and 103. In step 104, each of the dies 2 is encapsulated using an encapsulant 5 shown in FIG. 5, so as to permit the leads 32 of a respective one of the bonding parts 30 to be exposed from the encapsulant 5, thereby obtaining a plurality of encapsulated chips 6 on the lead frame 3. Specifically, the lead frame 3 bonded with the dies 2 is molded in a molding device (not shown), whilst the encapsulant 5 is introduced to the molding device so as to encapsulate each of the dies 2.

In step 105, the leads 32 of each of the bonding parts 30 are cut from the lead frame 3 so as to separate the encapsulated chips 6 from the lead frame 3.

Figure 6:
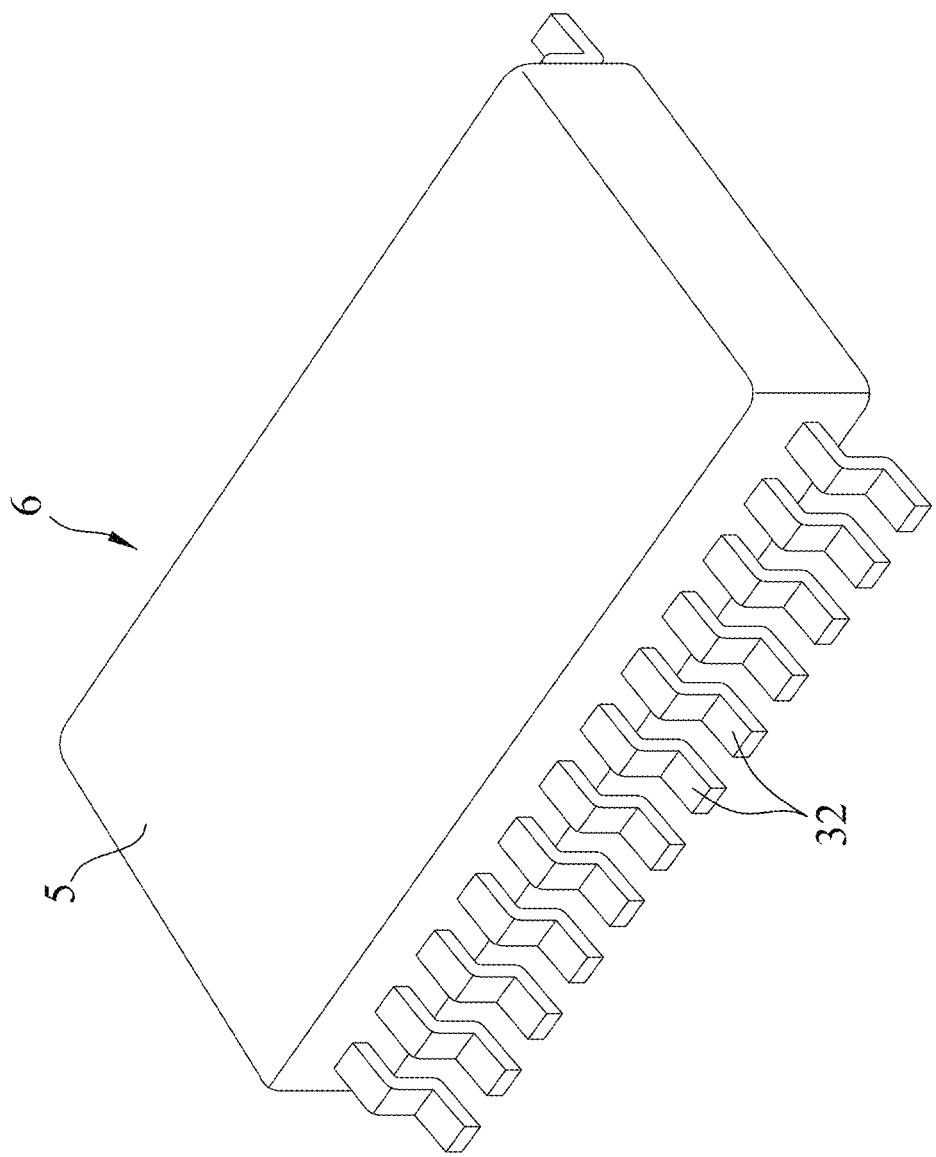
FIG. 6 is a schematic view illustrating the integrated circuit chip.

After step 105, the leads 32 of each of the encapsulated chips 6 may be subjected to a bending treatment, so as to obtain a packaged integrated circuit chip 6 having the bent leads 32 (see FIG. 6).

In summary, with the provision that the lead frame 3 is provided with the bumps 33 respectively on the leads 32, each of the dies 2 can be transferred to the die pad 31 in a flip-chip manner, and can be then directly bonded to the bumps 33 of the respective bonding part 30 through hot pressing. Therefore, compared with the conventional flip chip bonding process, the method of this disclosure avoids the bumping process, i.e., forming the bumps on the dies 2, so as to effectively enhance the overall packaging efficiency of the integrated circuit chip.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A method for packaging an integrated circuit chip, comprising the steps of:
    a) providing a plurality of dies and a lead frame, the lead frame including a plurality of bonding parts, each having
        a die pad,
        a plurality of leads each connected to the die pad and having an end region disposed on the die pad, and
        a plurality of bumps each disposed on the end region of a respective one of the leads and located above the die pad;
    b) transferring each of the dies to the die pad of a respective one of the bonding parts to permit each of the dies to be flipped on the respective bonding part, the bumps being sandwiched between the die pad and the dies; and
    c) hot pressing each of the dies and the die pad of a respective one of the bonding parts to permit each of the dies to be bonded to the bumps of the respective bonding part.

2. The method of claim 1, wherein step b) includes the sub-steps of:
    b1) disposing each of the dies on a temporary substrate; and
    b2) transferring each of the dies on the temporary substrate, by a suction device, to the die pad of the respective bonding part.

3. The method of claim 1, after step c), further comprising a step of:
    d) encapsulating each of the dies using an encapsulant so as to permit the leads of a respective one of the bonding parts to be exposed from the encapsulant, thereby obtaining a plurality of encapsulated chips on the lead frame.

4. The method of claim 3, after step d), further comprising a step of:
    e) cutting the leads of each of the bonding parts from the lead frame so as to separate the encapsulated chips from the lead frame.

5. The method of claim 4, wherein, for each of the encapsulated chips, the bumps are completely encapsulated by the encapsulant.

6. The method of claim 1, wherein each of the dies is an unpackaged integrated circuit chip.

7. The method of claim 1, wherein each of the dies has a die surface and a plurality of contact areas which are separately formed in the die surface, each of the contact areas being at a level not higher than that of the die surface, such that in step b), the contact areas of each of the dies are brought into register with the bumps of the respective bonding part, thereby permitting each of the dies to be bonded to the bumps of the respective bonding part in step c).

* * * * *